United States Patent [19]
Suh

[11] Patent Number: 6,093,612
[45] Date of Patent: Jul. 25, 2000

[54] METAL OXIDE SILICON FIELD EFFECT TRANSISTOR (MOSFET) AND FABRICATION METHOD OF SAME

[75] Inventor: Jai-Bum Suh, Choongcheongbuk-Do, Rep. of Korea

[73] Assignee: LG Semicon Co., Ltd., Cheongju, Rep. of Korea

[21] Appl. No.: 09/027,810

[22] Filed: Feb. 23, 1998

[30] Foreign Application Priority Data

May 24, 1997 [KR] Rep. of Korea ....................... 97-20561

[51] Int. Cl.[7] ................................................. H01L 21/336
[52] U.S. Cl. ..................... 438/301; 438/291; 438/299; 438/300; 438/303; 438/304
[58] Field of Search ..................................... 438/303, 301, 438/304, 299, 300, 291; 257/387, 392, 382

[56] References Cited

U.S. PATENT DOCUMENTS

| | | | |
|---|---|---|---|
| 5,338,698 | 8/1994 | Subbanna | 438/237 |
| 5,736,446 | 4/1998 | Wu | 438/305 |
| 5,817,562 | 10/1998 | Chang et al. | 438/305 |
| 5,869,374 | 2/1999 | Wu | 438/291 |
| 5,915,182 | 6/1999 | Wu | 438/299 |

*Primary Examiner*—Carl Whitehead, Jr.
*Assistant Examiner*—Khanh Duong
*Attorney, Agent, or Firm*—Fleshner & Kim, LLP

[57] ABSTRACT

A Metal Oxide Silicon Field Effect Transistor (MOSFET) and method includes a gate electrode pattern formed over a gate insulation layer on a semiconductor substrate. A pair of first impurity regions are respectively formed in an upper side surface of the substrate and adjacent to a side of the gate electrode pattern. A pair of first side wall spacers are respectively formed adjacent to a side wall of the gate electrode pattern, and a pair of air gaps are respectively formed between the gate electrode pattern and each of the side wall spacers. The MOSFET and method solve an increase problem of a fringing capacitor between a source and a gate electrode by forming an air gap along a side of the gate electrode. Further, a semiconductor chip area becomes decreased by forming a source and drain in a vertical structure. The source and drain formed of a side wall spacer further prevents a short channel effect from occurring. In addition, a cost reduction is achieved by adopting a self-alignment process.

19 Claims, 7 Drawing Sheets

METAL OXIDE SILICON FIELD EFFECT TRANSISTOR (MOSFET) AND FABRICATION METHOD OF SAME

BACKGROUND OF THE INVENTION

1. Field of the Invention

The present invention relates to a semiconductor device, and in particular, to a metal oxide silicon field effect transistor (hereinafter "MOSFET") for a semiconductor memory device and fabrication method of same.

2. Background of the Related Art

Figure 1:
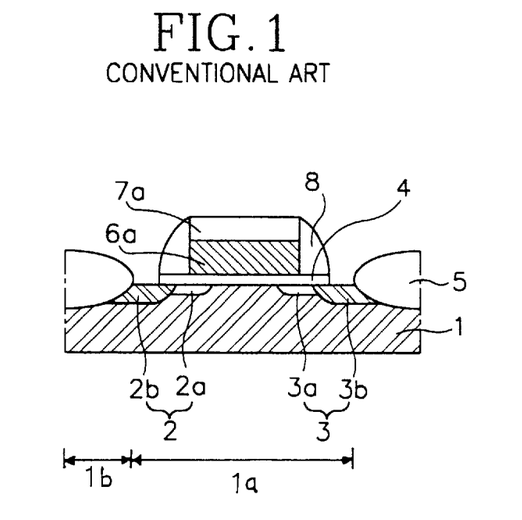
FIG. 1 is a schematic cross-sectional view of a related art MOSFET.

As shown in FIG. 1, a conventional MOSFET has an active region 1a and a field region 1b. The MOSFET includes a semiconductor substrate 1 defining a source 2 and a drain 3 in the active region 1a. A gate insulation layer 4 and a field insulation layer 5 are respectively formed on the active region 1a. A gate pattern 6a is formed on a surface portion of the gate insulation layer 4. A first insulation pattern 7a is formed on the gate pattern 6a and a side wall spacer 8 is formed on each side of the gate insulation layer 4 and serves as a second insulation layer. The source 2 is formed of a low density impurity region 2a and a high density impurity region 2b, and the drain 3 is formed of a low density impurity region 3a and a high density impurity region 3b.

Figure 2A:
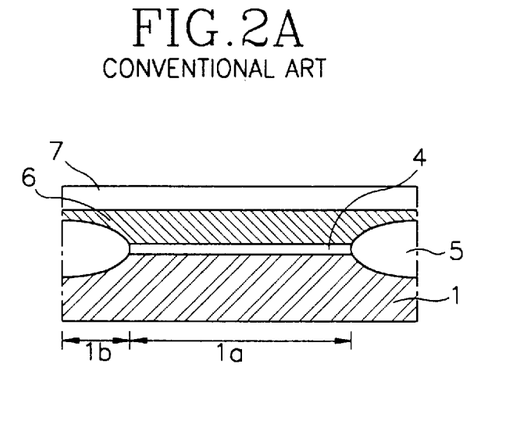
FIGS. 2A through 2E are sequential cross-sectional process views illustrating fabrication steps of the MOSFET of FIG. 1.

The fabrication process of the related art MOSFET will now be sequentially described with reference to FIGS. 2A through 2F. As shown in FIG. 2A, using a LOCOS method, an upper surface of semiconductor substrate 1 is defined into the active region 1a and the field region 1b. The gate insulation layer 4 is formed in the active region 1a and the field insulation layer 5 is formed in the field region, respectively, in an upper surface of a semiconductor substrate 1. A doped polysilicon layer is deposited on the gate and field insulation layers 4, 5 to serve as the gate 6, and a first insulation layer 7 is formed on the gate 6 using a CVD (Chemical Vapor Deposition) method.

Figure 2B:
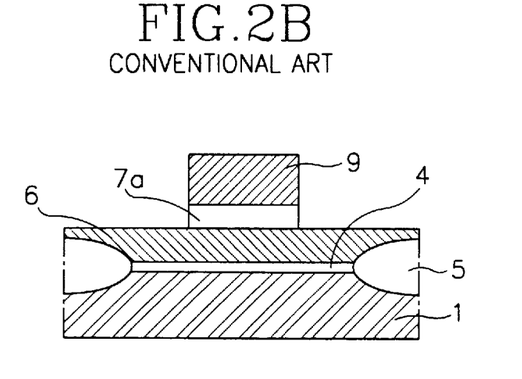
Figure 2C:
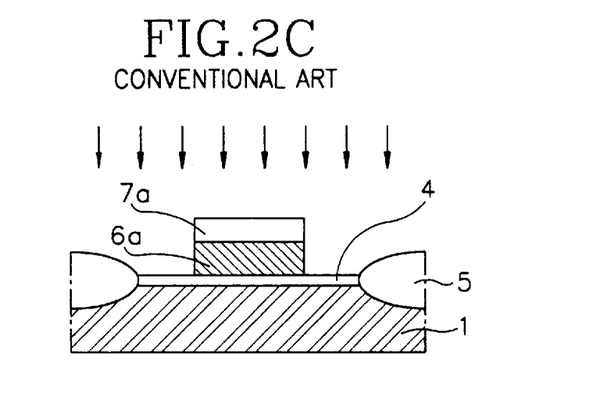

As further shown in FIG. 2B, a photoresist pattern 9 is formed on the first insulation layer 7. Using the photoresist pattern 9 as a mask, the first insulation layer 7 is etched to expose a predetermined region thereof and form a first insulation pattern 7a. Referring to FIG. 2C, the photoresist pattern 9 is removed. The gate 6 is etched to expose a predetermined region of the gate insulation layer 4 and form a gate pattern 6a.

Figure 2D:
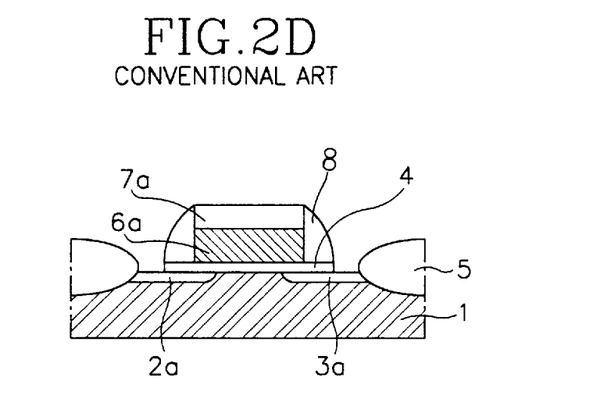

As shown in FIG. 2D, using the gate pattern 6a and the first insulation pattern 7a as a mask, lightly doped impurities are ion-implanted into the semiconductor substrate 1 to define portions of the source and drain 2a, 3a. An oxide material is formed on the respective upper surfaces of the gate insulation layer 4 and the field insulation layer 5 including the gate pattern 6a and the first insulation pattern 7a using a CVD method. The oxide material is etched-back for thereby forming a side wall spacer 8 on each side wall of the gate pattern 6a and the first insulation pattern 7a, and on a marginal upper surface of the gate insulation layer 4. At this time, the upper surface of the substrate 1 is partially exposed, and the low density impurity regions of the source and drain 2a, 3a are doped by n⁻ or p⁻.

Figure 2E:
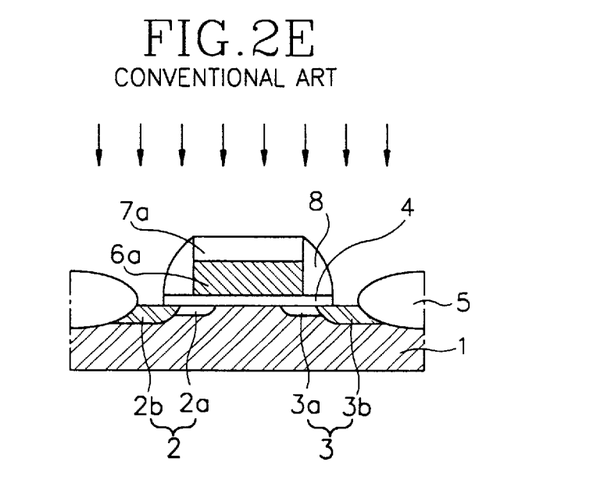

As shown in FIG. 2E, using the respective side wall spacers 8 as a mask, heavily doped impurities are ion-implanted into the exposed substrate 1. Accordingly, portions of the source and drain 2b, 3b that respectively serve as heavily doped impurity regions are defined to complete the related MOSFET fabrication. The heavily doped impurity regions 2b, 3b for the source and drain can be doped n⁺ or p⁺.

Figure 3:
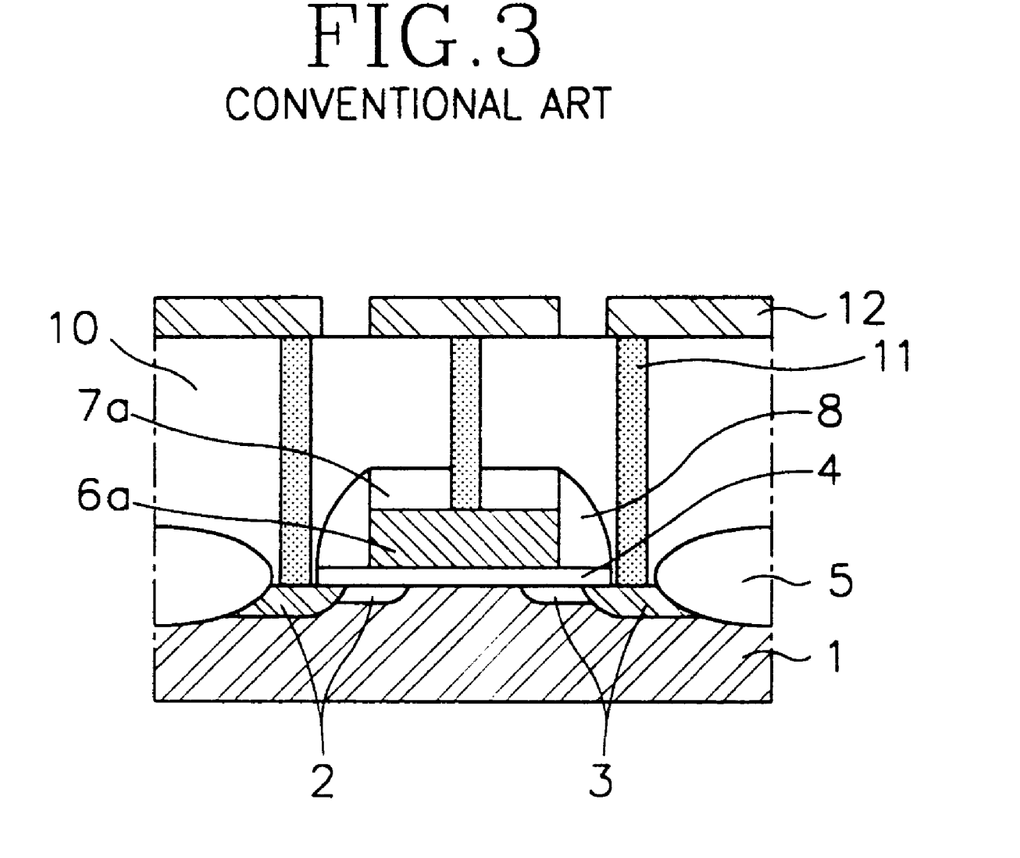
FIG. 3 is a schematic cross-sectional view of a related art MOSFET metallic wirework.

FIG. 3 shows a metallic wirework of a MOSFET having the structure of FIG. 1 further including a third insulation layer 10 formed on the exposed upper surface of the semiconductor substrate 1 including the field insulation layer 5, the side wall spacers 8, and the first insulation pattern 7a using a CVD method. A plurality of contact holes 11 are formed through the third insulation layer 10 to respectively expose upper surfaces of the gate pattern 6a and the source and drain regions 2b, 3b. A patterned metallic layer 12 is formed on the upper surface of the third insulation layer 10 including the contact holes 11.

As described above, the related art MOSFET has various disadvantages. The related art MOSFET is provided with a horizontal source and drain structure, so that the source and drain tend to occupy a considerable region on a semiconductor memory chip. Also, a fringing capacitor value increased because of a permitivity of the third insulation layer 10 formed between the gate 5 and the impurity regions 2, 3 operates to deteriorate a device characteristic and requires an isolation mask when forming the field region 1b. Such an isolation mask complicates a MOSFET fabrication process. Further, a junction depth becomes deepened when forming the source and drain 2b, 3b by ion-implanting heavily doped impurities and leads to a short channel effect.

The above references are incorporated by reference herein where appropriate for appropriate teachings of additional or alternative details, features and/or technical background.

SUMMARY OF THE INVENTION

An object of the present invention is to provide a MOSFET and method that substantially obviates at least the problems and disadvantages of the related art.

Another object of the present invention is to provide a MOSFET and method with an air gap formed between a gate electrode and an impurity region to improve a device characteristic.

A further object of the present invention to provide a MOSFET and method having a vertical structure source and drain.

A still further object of the present invention to provide a MOSFET and method that forms a side wall spacer serving as a source and drain to prevent a short channel effect.

A still further object of the present invention to provide a MOSFET having isolation between devices by a self-alignment.

A still further object of the present invention is to provide a MOSFET and method for fabricating same that increases a semiconductor memory device integration.

To achieve at least the above-described objects in whole or in parts, there is provided a MOSFET according to the present invention that includes a gate electrode pattern over a gate insulation layer formed on a semiconductor substrate that serves as a first insulation layer, a pair of first impurity regions respectively formed in an upper side surface of the substrate and adjacent to a side of the gate electrode pattern, a pair of first side wall spacers respectively formed adjacent to a side wall of the gate electrode pattern, and a pair of air gaps respectively formed between the gate electrode pattern and each of the side wall spacers.

Further, to achieve the above-described objects in a whole or in parts, there is provided a MOSFET according to the present invention that includes a gate electrode pattern over a gate insulation layer and serves as a first insulation layer formed on a semiconductor substrate, a pair of first impurity regions respectively formed in an upper side surface of the substrate and adjacent to a side of the gate electrode pattern, a pair of first side wall spacers respectively formed adjacent to a side wall of the gate electrode pattern, a pair of second side wall spacers respectively formed along an outer side surface of each of the first side wall spacers, and a pair of air gaps respectively formed between the gate electrode pattern and each of the side wall spacers.

Still further to achieve the above-described objects in a whole or in parts, there is provided a MOSFET according to the present invention that includes a semiconductor substrate with a plurality of steps symmetrically formed therein, a pair of first impurity regions respectively formed in an uppermost side surface of the substrate, a first insulation layer and a first conductive layer sequentially formed on the uppermost surface of the substrate, a pair of first side wall spacers respectively formed adjacent to a side wall of the first conductive layer and on each of the first impurity regions, and a pair of second side wall spacers respectively formed along a side wall that is commonly shared by each of the first side wall spacers and the first impurity regions, and on a step adjacent to the uppermost surface of the substrate.

Also, to achieve the above-described objects in a whole or in parts, there is provided a MOSFET fabrication method according to the present invention that includes forming a gate electrode pattern over a gate oxide layer on a semiconductor substrate, forming a pair of first impurity regions respectively in an upper side surface of the substrate and along a side of the gate electrode pattern, forming an insulation side wall on each side surface of the gate electrode pattern, forming a first side wall spacer on the insulation side wall, and forming an air gap by etching the insulation side wall.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 4:
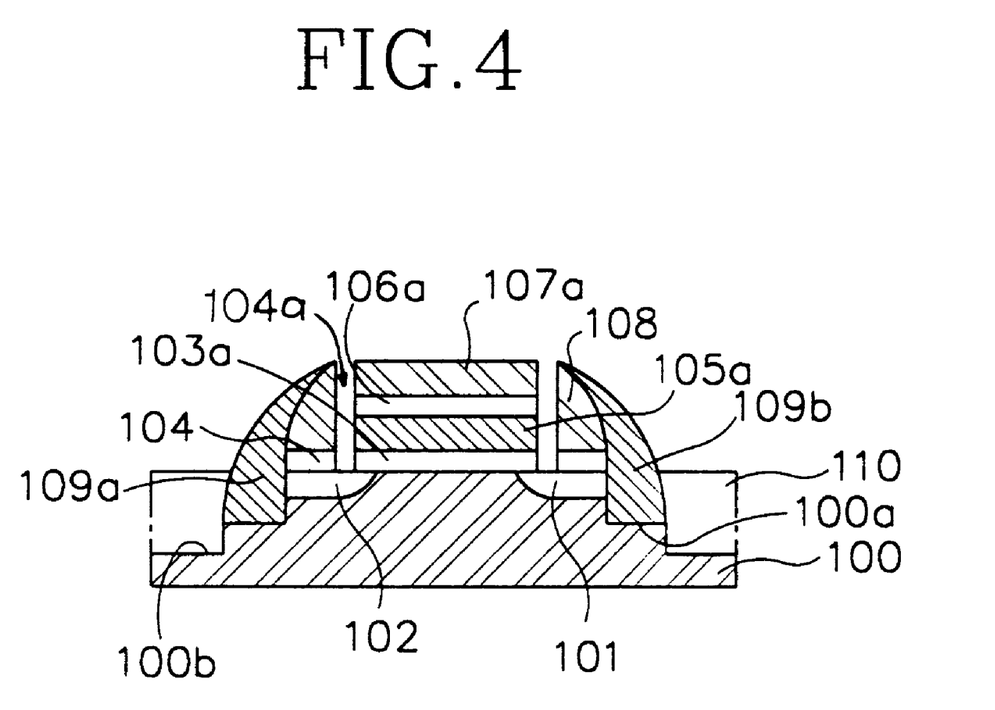
FIG. 4. is a schematic cross-sectional view of a preferred embodiment of a MOSFET according to the present invention.

As shown in FIG. 4, a cross-sectional view of a preferred embodiment of a MOSFET according to the present invention includes a semiconductor substrate 100 with first etching regions 100a and second etching regions 100b that have different etching depths and define a source 101 and a drain 102 that respectively serves as low density first impurity regions. A gate insulation pattern 103a is formed on a portion of the substrate 100. A first insulation layer 104 is formed on a side surface of the gate insulation pattern 103a and on a predetermined portion of the source and drain 101, 102. A first conductive pattern 105a serves as a conductive pattern. A second insulation pattern 106a and a first nitride pattern 107a are sequentially formed on the first conductive pattern 105a over a portion of the source and drain 101, 102. A side wall spacer 108 serves as a second nitride layer and is formed along the respective side surfaces of the gate insulation pattern 103a, the first conductive pattern 105a, the second insulation pattern 106a and the first nitride pattern 107a, and on a marginal surface of the first insulation layer 104.

The preferred embodiment further includes an air gap 104a formed between the respective side surfaces of the gate insulation pattern 103a, the first conductive pattern 105a, the second insulation pattern 106a and the first nitride pattern 107a, and the side wall spacer 108. Side wall spacers 109a, 109b serve as a second conductive layer with a heavy density and are formed along the respective side surfaces of the side wall spacer 108 serving as the second nitride layer, the first insulation layer 104 and the source and drain 101, 102 and in the first etching region 100a. A third insulation layer 110 is formed along the side surface of the side wall spacers 109a, 109b, which serve as the second conductive layer, in the second etching region 100b to have predetermined height. The first conductive pattern 105a is formed of polysilicon, and the third insulation layer 110 is formed of a field insulation layer.

Figure 5A:
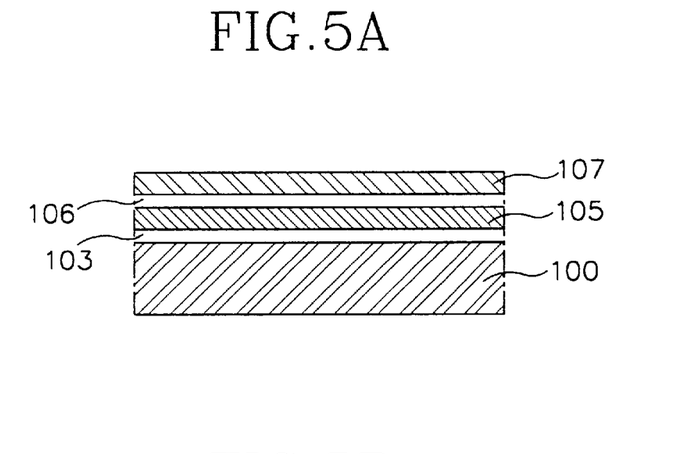
FIGS. 5A through 5G are cross-sectional views illustrating a preferred embodiment of a fabrication process according to the present invention.

A preferred embodiment of a fabrication method of a MOSFET according to the present invention will now be described with reference to FIGS. 5A through 5G. As shown in FIG. 5A, on a semiconductor substrate 100 formed of material such as Si, there is formed a gate insulation layer 103. A doped polysilicon layer serving as a first conductive layer 105 is formed on the gate insulation layer 103. A second insulation layer 106 is formed on the first conductive layer 105 using a CVD method. On the second insulation layer 106, there is formed a first nitride layer 107 formed of material such as $Si_3N_4$. The gate insulation layer 103 and the second insulation layer 106 are preferably formed of silicon oxide such as $SiO_2$.

Figure 5B:
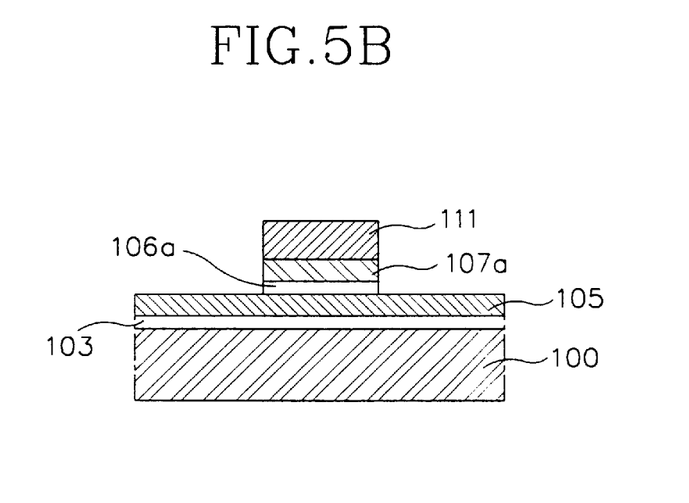

As shown in FIG. 5B, a photoresist pattern 111 is formed on the first nitride layer 107. Using the photoresist pattern 111 as a mask, the first nitride layer 107 and the second insulation layer 106 are sequentially etched so as to expose a surface portion of the first conductive layer 105 to form the first nitride pattern 107a and the second insulation pattern 106a.

Figure 5C:
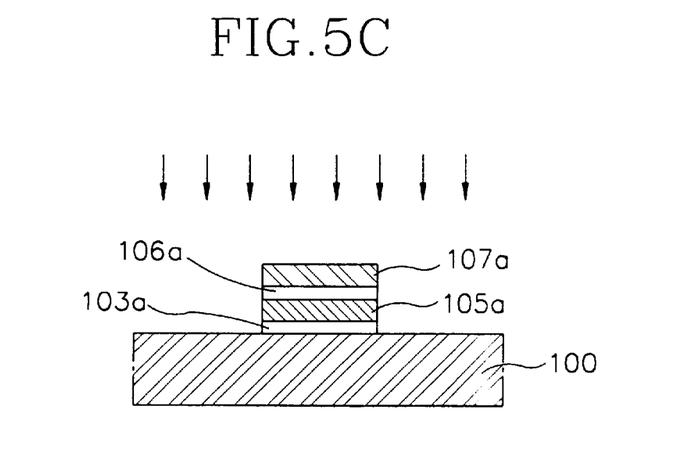

As shown in FIG. 5C, the photoresist pattern 111 is removed. Using the second insulation pattern 106a and the first nitride pattern 107a as a mask, the first conductive layer 105 and the gate insulation layer 103 are sequentially etched to expose a predetermined surface portion of the substrate 100, which also forms the first conductive pattern 105a serving as a gate electrode and the gate insulation pattern 103a. Then, low density impurities are ion-implanted into the semiconductor substrate 100 by using a self-alignment process.

Figure 5D:
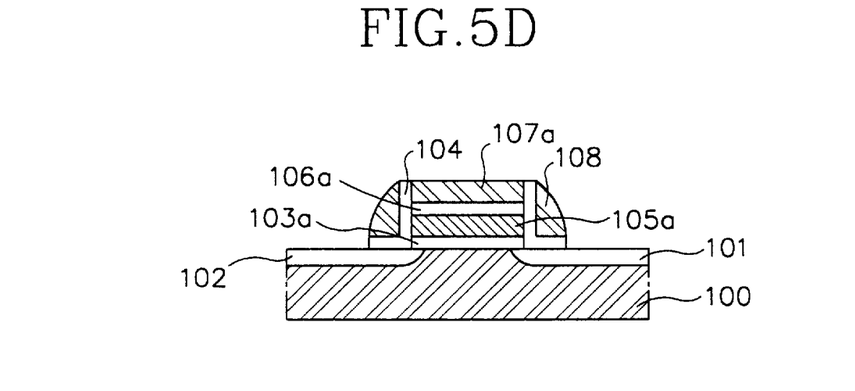

As shown in FIG. 5D, the source and drain 101, 102 respectively serving as low density first impurity regions are defined in an upper surface of the substrate 100. An oxide material is deposited on the substrate 100 including the gate insulation pattern 103a, the gate electrode 105a, the second insulation pattern 106a and the first nitride pattern 107a preferably using a CVD method. Then, a nitride material is preferably formed on the oxide material using a CVD method. The oxide material and the nitride material are etched-back to form the first insulation layer 104 and the second nitride layer 108. The second nitride layer 108 serves as a first side wall spacer along the respective side surfaces of the gate insulation layer pattern 103a, the gate electrode 105a, the second insulation pattern 106a and the first nitride pattern 107a.

Figure 5E:
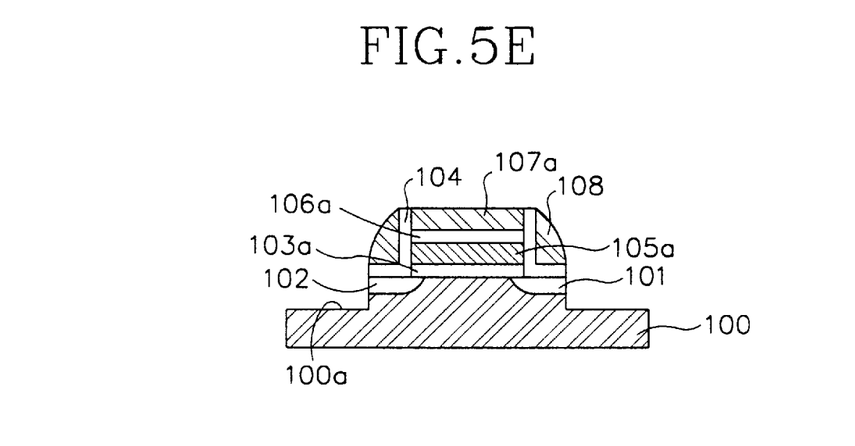
Figure 5F:
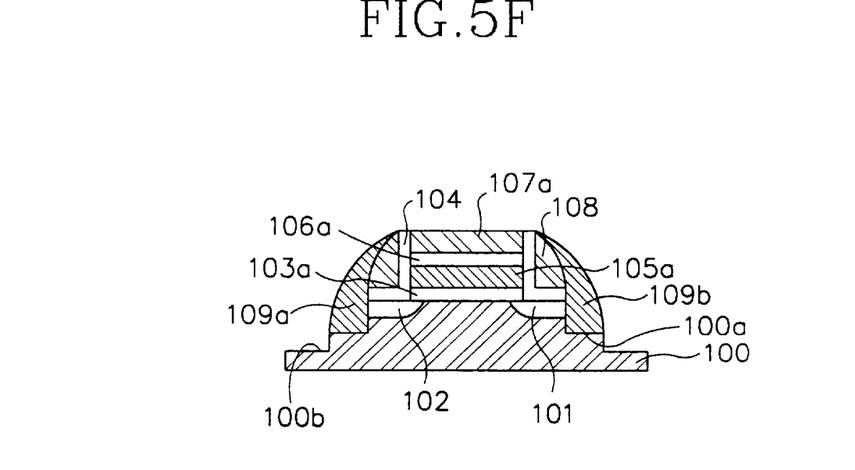

As shown in FIG. 5E, using the first nitride pattern 107a, the second nitride layer side wall spacer 108 and the first insulation layer 104 as a mask, the substrate 100 is etched to a first predetermined depth to form the first etching region 100a. Also, as shown in FIG. 5F, a conductive-material layer (e.g., polysilicon layer) doped by p+ or n+ is deposited on the respective surfaces of the first nitride pattern 107a, the side wall spacer 108, a first insulation layer 104 and the first etching region 100a. The conductive-material layer is etched back to form the second side wall spacers 109a, 109b respectively serving as a high density second impurity regions on the respective side walls of the gate insulation pattern 103a, the gate electrode 105a, the second insulation pattern 106a and the first nitride pattern 107a. While etching-back the conductive-material layer to form the second side wall spacers 109a, 109b, the semiconductor substrate 100 is preferably etched to a second predetermined depth to form the second etching region 100b.

Figure 5G:
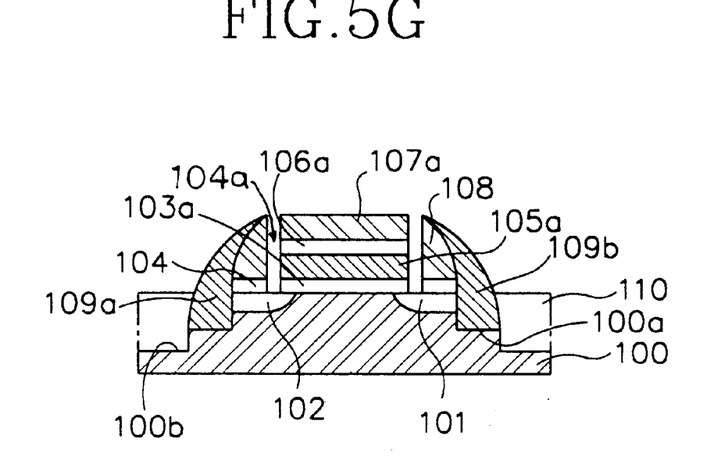

As shown in FIG. 5G, an oxide-material layer is deposited on the respective surfaces of the side wall spacers 108, 109a, 109b, the first nitride pattern 107a, the first insulation layer 104 and the second etching region 100b. The oxide-material layer is etched back to form a third insulation layer 110 serving as a field insulation layer on the respective side walls of the second conductive side wall spacers 109a, 109b in the second etching region 100b. While etching the third insulation layer 110, the first insulation layer 104 formed on the side walls of the side wall spacers 108 can be etched-back to form the air gap 104a. Thus, as shown in FIG. 5G, the preferred embodiment of a fabrication method of a MOSFET can be used to fabricate the preferred embodiment of a MOSFET shown in FIG. 4.

Figure 6:
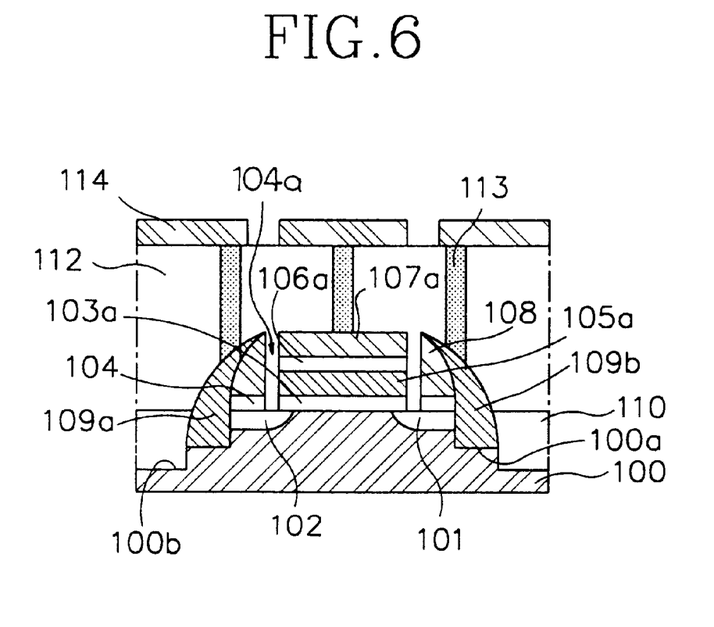
FIG. 6 is a schematic cross-sectional view of a preferred embodiment of a MOSFET metallic wirework according to the present invention.

FIG. 6 illustrates a preferred embodiment of a metallic wirework of the MOSFET according to the present invention. As shown in FIG. 6, an oxide-material layer is deposited on the side wall spacers 108, 109, the first nitride pattern 107a and the third insulation layer 110, with the exception of the air gap 104a, to form a fourth insulation layer 112. The fourth insulating layer 112 is preferably formed using a CVD method. To form a contact hole 113 in the wirework, the fourth insulation layer is etched to expose the second nitride layer 108, and a metallic pattern 114 is respectively formed in the contact hole 113 and on the fourth insulation layer 112.

As described above, the preferred embodiments of the MOSFET, fabrication method and wirework including the MOSFET have various advantages. The preferred embodiments of the MOSFET and method according to the present invention solves an increase problem of a fringing capacitor between a source and a gate electrode such as in the related art semiconductor memory device by forming an air gap in a side of the gate electrode. A semiconductor chip area becomes decreased by forming a source and drain in a vertical structure. Further, the source and drain in the format of a side wall spacer prevents a short channel effect from occurring. In addition, fabrication costs can be reduced by adopting a self-alignment process.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor memory device fabrication method, comprising the steps of:

sequentially forming a semiconductor substrate, a first layer and a second layer;

forming a pair of first impurity regions respectively in the substrate along sides of the second layer;

forming a first side wall on each side surface of the second layer;

forming a first side wall spacer on the first side wall; and forming an air gap by etching the first side wall, wherein a pair of second side wall spacers are respectively formed on each of the first side wall spacers and the semiconductor substrate.

2. The method of claim 1, further comprising the steps of:

forming a first insulation layer on the second layer; and forming a second insulation layer on the first insulation layer, wherein the first layer is a gate oxide layer, the second layer is a gate electrode pattern and the first side wall is an insulation side wall.

3. The method of claim 1, wherein the second side wall spacers are doped in a higher density than the first impurity regions.

4. The method of claim 2, wherein the air gaps are respectively formed along a common wall between the second layer, the first insulation layer and the second insulation layer, and wherein the air gaps are substantially the same height as the side wall spacers.

5. The method of claim 1, further comprising:

forming a first insulation layer over the second layer, the first side wall spacer and the second side wall spacer to seal the air gaps; and forming a pair of first metals, respectively, in each of a pair of first contact holes formed to contact an upper surface of the second side wall spacers.

6. The method of claim 5, further comprising:

forming a second metal in a second contact hole formed to contact the second layer.

7. A semiconductor memory device fabrication method, comprising:

forming a gate insulation layer on a semiconductor surface;

forming a gate electrode on the gate insulation layer;

forming a pair of first impurity regions, respectively, in the substrate adjacent to sides of the gate electrode; and forming a pair of first side wall spacers spaced by air gaps from each of the sides of the gate electrode and electrically coupled to the first impurity regions, wherein the first side wall spacers are doped in a higher concentration than the first impurity regions, wherein the first impurity regions are LDD source and drain regions, and wherein the first side wall spacers are source and drain regions.

8. The method of claim 7, wherein the air gaps are respectively formed by removing an insulation material.

9. The method of claim 7, further comprising forming a pair of second side wall spacers between the first side wall spacers and the air gaps, wherein the second side wall spacers are insulating side wall spacers.

10. The method of claim 9, further comprising:

forming a first insulation layer over the gate electrode, the first side wall spacers and the second side wall spacers to seal the air gaps;

forming a first metal in a first contact hole formed in the first insulation layer to contact an upper surface portion of the gate electrode; and forming a pair of second metals, respectively, in each of a pair of second contact holes formed in the first insulation layer to contact an upper surface of the first side wall spacers.

11. The method of claim 7, further comprising:

forming a first insulation layer on the gate electrode; and forming a second insulation layer on the first insulation layer.

12. The method of claim 11, wherein the air gaps are respectively formed along a common wall between the gate electrode, the first insulation layer and the second insulation layer, and wherein the air gaps are substantially the same height as the first side wall spacers.

13. The method of claim 7, wherein the substrate has a plurality of steps symmetrically formed on both sides of a first region, wherein the first impurity regions are in a first step, the first side wall spacers are in a second step, and a field oxide layer is in a third step, and wherein the first step forms a top surface and the third step forms a lowest surface and the second step is between the first and third steps in height.

14. The method of claim 7, wherein the first impurity regions are horizontally formed in the upper surface of the substrate adjacent to the first side wall spacers, which have a vertical shape.

15. A semiconductor memory device fabrication method, comprising:

forming a semiconductor substrate with a plurality of steps symmetrically formed on both sides of a first region;

forming a pair of first impurity regions respectively on a first step of the plurality of steps;

forming a gate electrode over the first region and a portion of the pair of first impurity regions;

forming a first insulation layer adjacent sides of the gate electrode and on each of the first impurity regions;

forming first side wall spacers adjacent each of the first insulation layers over the first impurity regions; and forming second side wall spacers along each of the first side wall spacers and the first impurity regions on a second step of the plurality of steps wherein the second side wall spacers are doped in a higher concentration than the first impurity regions.

16. The method of claim 15, wherein a second insulation layer is formed on a third step of the plurality of steps along an outer side surface of each of the second side wall spacers, and wherein the first step forms a top surface and the third step forms a lowest surface and the second step is between the first and third steps in height.

17. The method of claim 15, further comprising forming air gaps adjacent the sides of the gate electrode by removing the first insulation layer.

18. The method of claim 17, further comprising:

wherein the air gaps are respectively formed by etching along a common wall between the gate electrode and a gate insulation layer, and wherein the air gaps are substantially the same height as the side wall spacers.

19. A semiconductor memory device fabrication method, comprising:

forming a gate insulation layer on a semiconductor surface;

forming a gate electrode on the gate insulation layer;

forming a pair of first impurity regions, respectively, in the substrate adjacent to sides of the gate electrode; and forming a pair of first side wall spacers spaced by air gaps from each of the sides of the gate electrode and electrically coupled to the first impurity regions, wherein the first side wall spacers are doped in a higher concentration than the first impurity regions, wherein the substrate has a plurality of steps symmetrically formed on both sides of a first region, wherein the first impurity regions are in a first step and the first side wall spacers are in a second step, which is lower than the first step in height relative to the gate insulation layer.

* * * * *